United States Patent
Son et al.

(10) Patent No.: US 9,001,601 B2
(45) Date of Patent: Apr. 7, 2015

(54) MEMORY DEVICE INCLUDING REPAIR CIRCUIT AND REPAIR METHOD THEREOF

(75) Inventors: Jong-pil Son, Seongnam-si (KR); Chul-woo Park, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 273 days.

(21) Appl. No.: 13/601,725

(22) Filed: Aug. 31, 2012

(65) Prior Publication Data

US 2013/0083612 A1 Apr. 4, 2013

Related U.S. Application Data

(60) Provisional application No. 61/541,153, filed on Sep. 30, 2011.

(30) Foreign Application Priority Data

Mar. 12, 2012 (KR) .................. 10-2012-0025217

(51) Int. Cl.
  *G11C 29/00* (2006.01)
  *G11C 29/44* (2006.01)
(52) U.S. Cl.
  CPC .......... *G11C 29/808* (2013.01); *G11C 29/4401* (2013.01); *G11C 2029/4402* (2013.01)

(58) Field of Classification Search
  USPC ............................ 365/154, 189.01, 200, 201
  See application file for complete search history.

(56) References Cited

U.S. PATENT DOCUMENTS

2006/0203567 A1* 9/2006 Poechmueller .......... 365/189.01
2006/0233011 A1* 10/2006 Matsuoka et al. .............. 365/49

FOREIGN PATENT DOCUMENTS

WO WO-2011062825 A2 5/2011

* cited by examiner

*Primary Examiner* — Thao H Bui
(74) *Attorney, Agent, or Firm* — Harness, Dickey & Pierce, P.L.C.

(57) ABSTRACT

A memory device includes a repair circuit including a fail bit location information table configured to store row and column addresses of a defective cell in a normal area of a memory cell array. The repair circuit also includes a row address comparison unit configured to compare the row address of the defective cell with a row address of a first access cell received from the outside, and to output a first row match signal when the defective cell's row address matches the row address of the first access cell, and a column address comparison unit configured to compare the column address of the defective cell with a column address of the first access cell received from the outside, and to output a first column address replacement signal if the column address of the defective cell is the same as the column address of the first access cell.

14 Claims, 15 Drawing Sheets

MEMORY DEVICE INCLUDING REPAIR CIRCUIT AND REPAIR METHOD THEREOF

CROSS-REFERENCE TO RELATED APPLICATIONS

This application claims the benefit of U.S. Provisional Application No. 61/541,153, filed on Sep. 30, 2011, in the United States Patent and Trademark Office (USPTO) and Korean Patent Application No. 10-2012-0025217, filed on Mar. 12, 2012, in the Korean Intellectual Property Office (KIPO), the disclosures of which are incorporated herein in their entirety by reference.

BACKGROUND

One or more example embodiments of the inventive concepts relate to a memory device including a repair circuit and/or a repair method thereof. More particularly, to a memory device including a repair circuit for effectively repairing a defective cell, and/or a repair method thereof.

Memory devices have a wide range of applications in a variety of electronic products, for example, computers or mobile systems. The fast development of multimedia has recently led to a demand for high-capacity compact memory devices. Accordingly, as memory devices become smaller and highly integrated, the number of defective cells of memory devices has greatly increased. Such an increase in the number of defective cells causes a reduction in production yield of memory devices and makes it difficult to secure a high memory capacity. In addition, a plurality of additional spare cells are necessary for repairing defective cells, which makes it much more difficult to realize high-capacity compact storage memory devices.

SUMMARY

One or more example embodiments of the inventive concepts provide a memory device including a repair circuit capable of effectively repairing defective cells by using a minimum number of additional spare cells, and/or a repair method thereof.

According to an example embodiment of the inventive concepts, there is provided a memory device including a repair circuit, the repair circuit including a fail bit location information table configured to store row address information and column address information of at least one defective cell in a normal area of a memory cell array; a row address comparison unit configured to store the row address information of the at least one defective cell, the row address information provided from the fail bit location information table, to compare the row address information of the at least one defective cell with a row address of a first access cell received from the outside, and to output a first row match signal if a first defective cell matches the row address from among the at least one defective cell; and a column address comparison unit configured to store the column address information of the at least one defective cell, is the column address information provided from the fail bit location information table, to output column address information of the first defective cell according to the first row match signal, to compare the column address information of the first defective cell with a column address of the first access cell received from the outside, and to output a first column address replacement signal for repairing the first defective cell if the column address information of the first defective cell is the same as the column address of the first access cell.

The memory device may further include a column decoder configured to disable the column address of the first access cell and to enable a column address of a first spare column address, according to the first column address replacement signal received from the column address comparison unit; and a row decoder for enabling a row address of the first access cell, according to the row address of the first access cell. The first defective cell may be replaced with a first spare cell connected to an intersection of a row corresponding to the row address of the first access cell and the first spare column, in a spare area disposed separately from the normal area of the memory cell array.

The row address comparison unit may be configured to compare a row address of a second access cell received from the outside that is different from the row address of the first access cell with the row address information of the at least one defective cell, and then to output a second row match signal if a second defective cell matches the row address of the second access cell. The column address comparison unit may be configured to output column address information of the second defective cell according to the second row match signal, to compare the column address information of the second defective cell with a column address of the second access cell received from the outside, and to output the first column address replacement signal if the column address information of the second defective cell is the same as the column address of the second access cell. The row decoder may be configured to enable the row address of the second access cell according to the row address of the second access cell. The second defective cell may be replaced with a second spare cell connected to an intersection of a row corresponding to the row address of the second access cell and the first spare column, in the spare area.

The row address comparison unit may be configured to compare the row address information of the at least one defective cell with a row address of a third access cell received from the outside that has a row address that is the same as the row address of the first access cell and a column address that is different from the column address of the first access cell, and to output a third row match signal if a third defective cell matches the row address of the third access cell from among the at least one defective cell. The column address comparison unit may output column address information of the third defective cell according to the third row match signal, compare the column address information of the third defective cell with a column address of the third access cell received from the outside, and output a second column address replacement signal when the column address information of the third defective cell is the same as the column address of the third access cell. The column decoder may be configured to disable the column address of the third access cell and to enable a second spare column address, according to the second column address replacement signal received from the column address comparison unit. The third defective cell may be replaced with a third spare cell connected to an intersection of a row corresponding to the row address of the third access cell and the second spare column, in the spare area.

The fail bit location information table may be further configured to store row address information and column address information of at least defective spare cell occurring in the spare area disposed separately from the normal area of the memory cell array. The memory device may further include a spare cell repair unit configured to output a row address replacement signal for disabling a row address of the at least one defective spare cell and to enable a spare row address, according to the row address information of the at least one defective spare cell the fail bit location information table.

Before the repair circuit receives the row address and column address of the first access cell from the outside and replaces the first defective cell with the first spare cell, the spare cell repair unit may output the row address replacement signal.

The fail bit location information table may be configured to store the row address information and column address information of the at least one defective cell by using an anti-fuse.

The row address comparison unit may include a content addressable memory (CAM).

The column address comparison unit may include a storage unit configured to store the column address information of the at least one defective cell, and to output the column address information of the at least one defective cell, according to toe first row match signal; and a comparator configured to compare the column address information of the at least one defective cell received from the storage unit with the column address of the first access cell, and to output the first column address replacement signal when the column address information of the at least one defective cell is the same as the column address of the first access cell.

The storage unit may include a static random access memory (SRAM).

The comparator may include an XOR gate.

According to another example embodiment of the inventive concepts, there is provided a method of repairing a memory device, the method including reading row address information and column address information of at least one defective cell occurring in a normal area of a memory cell array, from a fail bit location information table; storing the row address information of the at least one defective cell in a row address comparison unit, and storing the column address information of the at least one defective cell in the column address comparison unit; comparing a row address of a first access cell, which is received from the outside by using the row address comparison unit, with the row address information of the at least one defective cell; if a first defective cell, the row address information of which is the same as the row address of the first access cell from among the at least one defective cell, comparing a column address of the first access cell, which is received from the outside by using the column address comparison unit, with column address information of the first defective cell; and if the column address of the first access cell is the same as the column address information of the first defective cell, replacing the first defective cell with a first spare cell included in a spare area disposed separately from the normal area of the memory cell array.

The method may further include comparing a row address of a second access cell received from the outside with the row address information of the at least one defective cell; if a second defective cell, the row address information of which is the same as the row address of the second access cell from among the at least one defective cell, comparing a column address of the second access cell received from the outside with column address information of the second defective cell; and if the column address of the second access cell is the same as the column address information of the second defective cell, replacing the second defective cell with a second spare cell or a third spare cell included in the spare area disposed separately from the normal area of the memory cell array. If the row address of the second access cell is different from the row address of the first access cell, the second defective cell may be replaced with the second spare cell disposed at the same column at which the first spare cell is disposed. If the row address of the second access cell is the same as the row address of the first access cell and the column address of the second access cell is different from the column address of the first access cell, the second defective cell may be replaced with the third spare cell disposed at a column different from the column at which the first spare cell is disposed.

According to an example embodiment of the inventive concepts, there is provided a memory device including a repair circuit, the repair circuit including a comparison unit configured compare a row address of a first access cell to row address information of at least one defective cell, to compare a column address of the first access cell to the column address information of a first defective cell from the at least one defective cell if a row address of the first defective cell matches the row address of the first access cell, and to output a first column address replacement signal if the column address information of the first defective cell is the same as the column address of the first access cell.

The memory device may further include a fail bit location information table for storing row address information and column address information of at least one defective cell occurring in a normal area of a memory cell array.

The comparison unit may include a row address comparison unit for storing the row address information of the at least one defective cell, which is provided from the fail bit location information table, a column address comparison unit for storing the column address information of the at least one defective cell, which is provided from the fail bit location information table.

BRIEF DESCRIPTION OF THE DRAWINGS

Example embodiments of the inventive concepts will be more clearly understood from the following detailed description taken in conjunction with the accompanying drawings in which.

Figure 1:
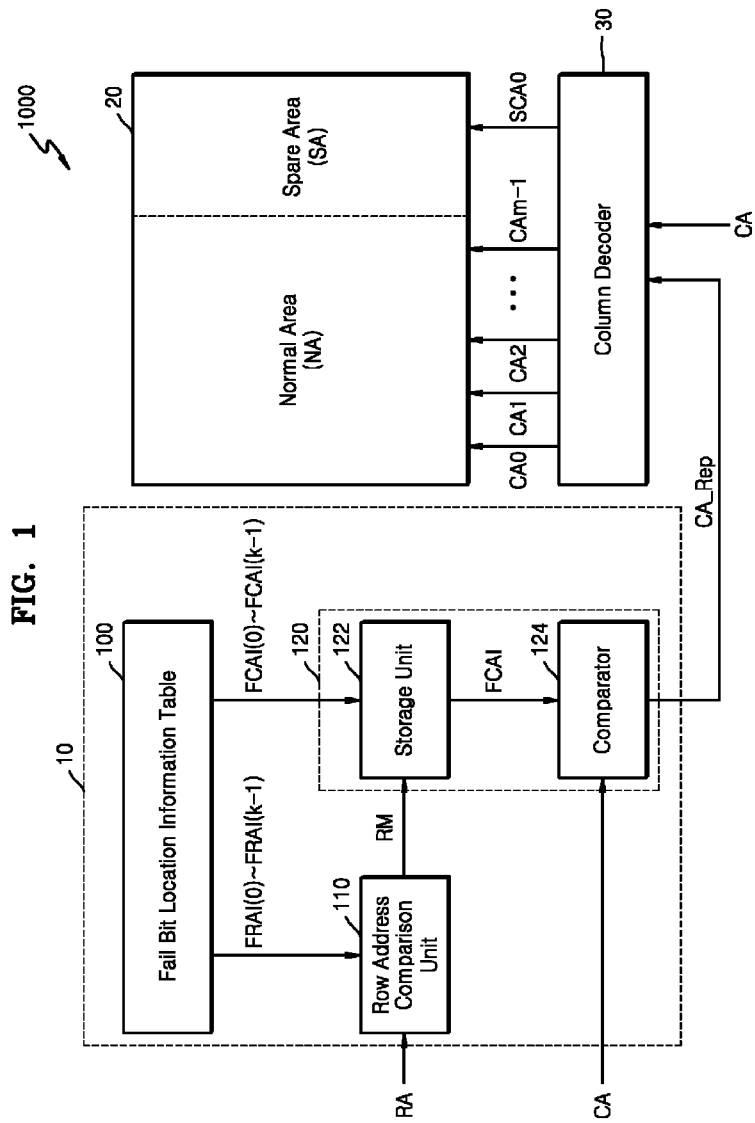
FIG. 1 is block diagram of a memory device including a repair circuit, according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments of the inventive concepts will be described more fully with reference to the accompanying drawings. The inventive concepts may, however, be embodied in many different forms and should not be construed as limited to the example embodiments set forth herein. Rather, these example embodiments are provided so that this disclosure will be thorough and complete, and will fully convey the scope of the inventive concepts to those of ordinary skill in the art. Like reference numerals denote like elements throughout the drawings. In the drawings, the lengths and sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concepts. As used herein, the singular forms 'a', 'an', and 'the' are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

A memory capacity of a memory device, for example, dynamic random access memory (DRAM), is scaled to 2i Gb, e.g., 1 Gb, 2 Gb, 4 Gb, or 8 Gb. Here, "i" denotes the number of addresses. A highly integrated memory device is necessarily manufactured in order to increase the memory capacity of a DRAM through continuous scaling, and thus a process of manufacturing the DRAM becomes finer. However, the finer the process of manufacturing the DRAM, the greater the number of hard or soft defective memory cells (hereinafter referred to as 'defective cells'). In this regard, hard defective cells mean memory cells having permanent defects, and soft defective cells mean memory cells having minor defects, i.e., temporarily defective memory cells.

A repair method of repairing defective cells with spare cells separately from normal cells has been employed to secure a full memory capacity of a DRAM. For example, a method of replacing rows including defective cells with spare rows (a row repair method) or a method of replacing columns including defective cells with spare columns (a column repair method) is employed.

For convenience of explanation, a case where a memory device including a repair circuit according to an example embodiment of the inventive concepts is a DRAM is described below, but example embodiments of the inventive concepts are not limited to DRAM. A memory device according to an example embodiment of the inventive concepts may include resistive random access memory (RRAM), phase RAM (PRAM), magnetic RAM (MRAM), or spin transfer torque MRAM (STT-MRAM). A repair circuit according to an example embodiment of the inventive concepts are described below as repairing a defective cell, based on the column repair method, but the technical idea of the inventive concepts may apply to a case where a defective cell is repaired based on the row repair method.

FIG. 1 is block diagram of a memory device 1000 including a repair circuit 10, according to an example embodiment of the inventive concepts. Referring to FIG. 1, the memory device 1000 may include a repair circuit 10, a memory cell array 20, and a column decoder 30. The repair circuit 10 may include a fail bit location information table 100, a row address comparison unit 110, and a column address comparison unit 120.

The fail bit location information table 100 stores location information of at least one defective cell occurring in a normal area NA of the memory cell array 20. The fail bit location information table 100 includes non-volatile memory devices to store the location information of the at least one defective cell. For example, the fail bit location information table 100 may include anti-fuses (AFs) to store the location information of the at least one defective cell. The location information of the at least one defective cell stored in the fail bit location information table 100 may be updated. For example, location information of defective cells that occur in the normal area NA, caused when the memory device 1000 is continuously used, may be updated in the fail bit location information table 100. Also, location information of additional defective cells occurring after the memory device 1000 is packaged may be updated in the fail bit location information table 100. Such location information of defective cells may be obtained by testing whether a fail bit occurs in the memory device 1000. The test may be performed before the memory device 1000 is packaged, i.e., at a wafer level, or may be performed after the memory device 1000 is packaged. A post-package repair (PPR) may be performed using the repair circuit 10 according to an example embodiment of the inventive concepts, as will be described with reference to FIGS. 7 and 8 below.

The location information of the at least one defective cell may be row address information FRAI and/or column address information FCAI of the at least one defective cell. A case where a plurality of defective cells, e.g., k defective cells, occur in the normal area NA, and the fail bit location information table 100 stores row address information FRAI(0) to FRAI(k-1) and column address information FCAI(0) to FCAI (k-1) of the plurality of defective cells, will now be described. Here, 'k' denotes a natural number. Also, a case where a defective cell occurs in each of at least one row of the normal area NA will be described below. A case where at least two defective cells occur in each of at least one row of the normal area NA will further be described below.

The fail bit location information table 100 may also store location information of at least one defective spare cell occurring in a spare area SA of the memory cell array 20. The location information of the at least one defective spare cell may also be updated by testing whether a fail bit occurs in the memory device 1000. Although FIG. 1 illustrates that the fail bit location information table 100 is included in the memory device 1000, example embodiments of the inventive concepts are not limited thereto. The fail bit location information table 100 may be located outside the memory device 1000, e.g., a memory controller (not shown).

The row address comparison unit 110 stores the row address information FRAI(0) to FRAI(k-1) of the plurality of defective cells received from the fail bit location information table 100 of the memory device 1000. The row address comparison unit 110 may receive the row address information FRAI(0) to FRAI(k-1) from the fail bit location information table 100 simultaneously when the memory device 1000 is driven or a desired time period after the memory device 1000 is driven.

The row address comparison unit 110 receives a row address RA of a normal cell to be accessed (hereinafter referred to as an 'access cell') from the outside, e.g., a memory controller (not shown) that controls data to be written to or read from the memory device 1000. The row address comparison unit 110 compares the row address RA of the access cell with the row address information FRAI(0) to FRAI(k-1), and outputs a row match signal SM when a defective cell matches the row address RA from among the plurality of defective cells.

The column address comparison unit 120 may include a storage unit 122 and a comparator 124. The storage unit 122 stores the column address information FCAI(0) to FCAI(k-1) of the plurality of defective cells received from the fail bit location information table 100 of the memory device 1000. Similar to the row address comparison unit 110, the storage unit 122 may receive the column address information FCAI (0) to FCAI(k-1) simultaneously when the memory device 1000 is driven or a desired time period after the memory device 1000 is driven. The storage unit 122 outputs column address information FCAI of the defective cell that matches the row address RA of the access cell, according to the row match signal RM. The comparator 124 compares a column address CA of the access cell received from the outside, for example, the memory controller, with the column address information FCAI of the defective cell and then outputs a column address replacement signal CA_Rep to repair the defective cell when the column address CA is the same as the column address information FCAI.

Figure 7:
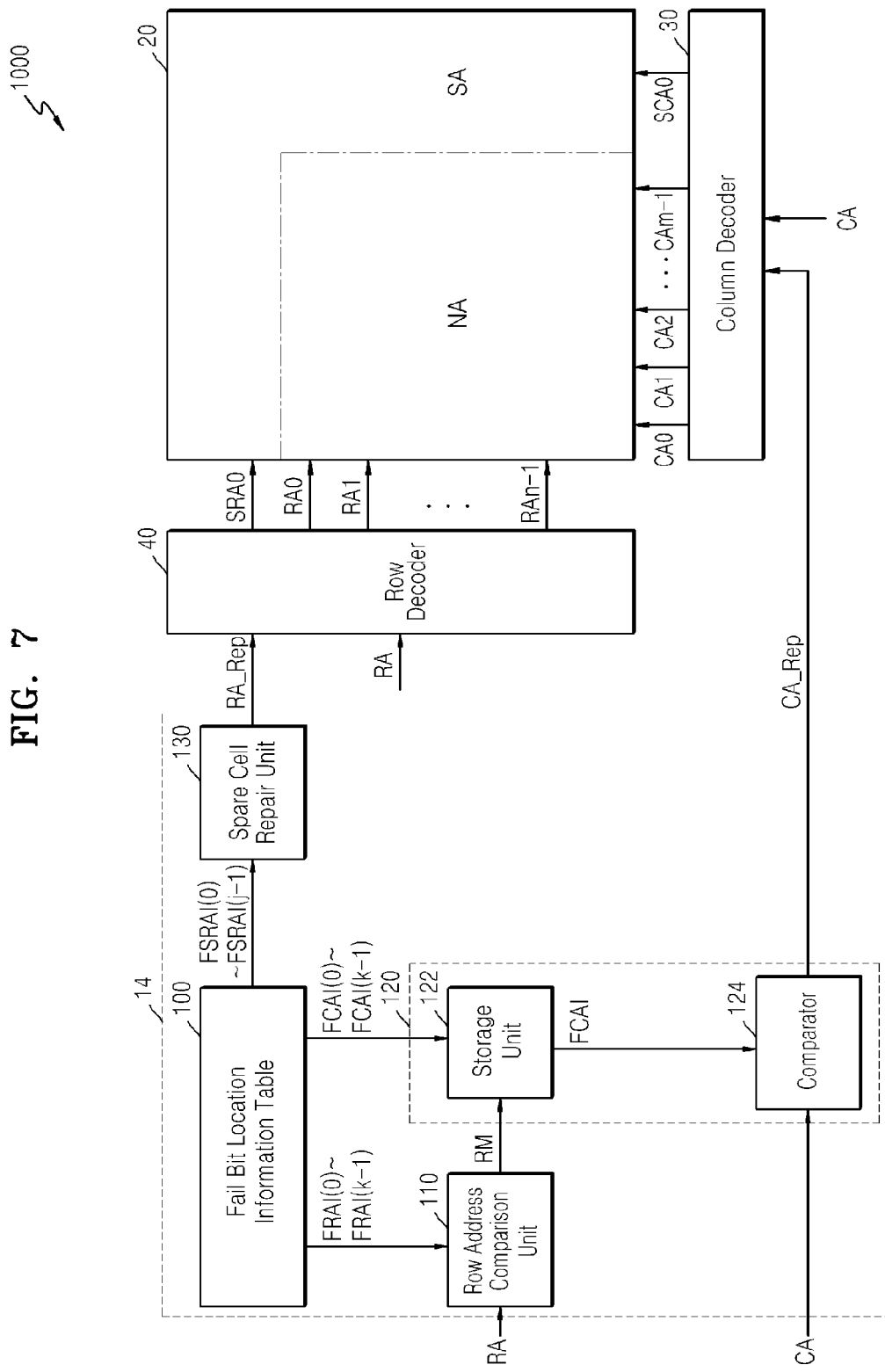
FIG. 7 is a block diagram of a memory device including a repair circuit, according to another example embodiment of the inventive concepts.

The memory cell array 20 is divided into the normal area NA and the spare area SA. The normal area NA includes n×m normal cells being respectively connected to intersections of n rows and m columns. The spare area SA includes a plurality of spare cells being respectively connected to intersections of the n rows and at least one spare column. The normal cells mean memory cells that store data received from the outside according to a control signal, for example, an address signal, which is received from the outside. The spare cells mean memory cells to be accessed so as to replace defective cells having a fail bit from among the normal cells, when the defective cells are accessed. The normal cells and the spare cells may each have a DRAM cell structure. Although FIG. 1 only illustrates the spare area SA as an area corresponding to the at least one spare column, an area including a plurality of spare cells connected to intersections of at least one spare row and the at least one spare column may also be a spare area SA, as illustrated in FIG. 7.

The column decoder 30 disables a column address CA of an access cell from among addresses CA0, CA1, CA2, . . . , to CAm-1 corresponding to the m columns of the normal area NA and enables a spare column address SCA0, according to the column address replacement signal CA_Rep received from the column address comparison unit 120. If the column address CA of the access cell and the column address information FCAI are not the same and the column address replacement signal CA_Rep is thus not activated, then the column decoder 30 enables the column address CA of the access cell.

Although not shown in FIG. 1, the memory device 1000 may further include a row decoder. The defective cell may be replaced with a spare cell by enabling a row corresponding to the row address RA of the access cell by using the row decoder and enabling a spare column corresponding to the spare column address SCA0 by using the column decoder 30.

If a cell that is to be accessed is a defective cell, the repair circuit 10 replaces the defective cell with a spare cell. If a cell that is to be accessed is not a defective cell, for example, if location information of the defective cell is not the same as the row address RA and/or column address CA of the access cell, then the access cell may be accessed. Structures and operations of the fail bit location information table 100, the row address comparison unit 110, and the column address comparison unit 120 will be described in detail with reference to FIGS. 1 to 3 below.

Figure 2:
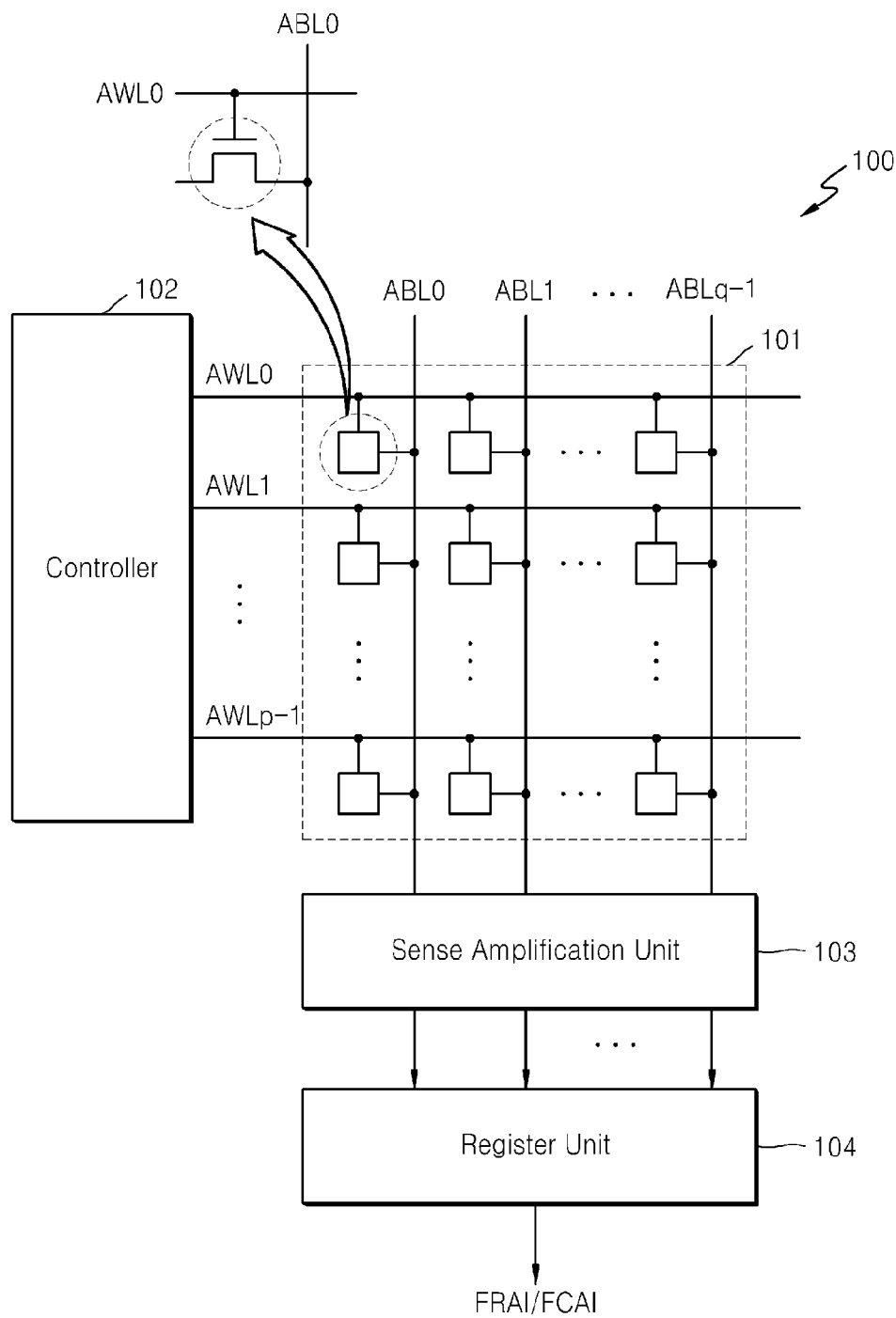
FIG. 2 illustrates the structure of a fail bit location information table of FIG. 1, according to an example embodiment of the inventive concepts.

FIG. 2 illustrates the structure of the fail bit location information table 100 of FIG. 1, according to an example embodiment of the inventive concepts. Referring to FIGS. 1 and 2, the fail bit location information table 100 may include a plurality of anti-fuses (AFs) and store location information of defective cells by using the anti-fuses (AFs). The anti-fuses (AFs) may be programmed to a low resistance state from a high resistance state so as to store information, unlike a general fuse circuit, for example, a laser fuse circuit or an electrical fuse circuit. The anti-fuses (AFs) may be embodied as, for example, depletion type MOS transistors, and each of the anti-fuses (AFs) may be programmed by breaking down a gate oxide layer thereof by applying high voltage between a node connected to a gate electrode and a common node connected to a source and a drain. Each of the anti-fuses (AFs) may include, for example, a capacitor (not shown) having two conductive layers and a dielectric layer between the two conductive layers. In this case, each of the anti-fuses (AFs) may be programmed by breaking down the dielectric layer by applying high voltage between the two conductive layers.

The fail bit location information table 100 may have an array structure in which the anti-fuses (AFs) are respectively connected to intersections of a plurality of rows and a plurality of columns. The fail bit location information table 100 may have an anti-fuse array 101 in which p×q anti-fuses (AFs) are respectively connected to intersections of p rows and q columns. The anti-fuse array 101 includes p word lines AWL0 to AWLp-1 for accessing anti-fuses (AFs) disposed at the p rows, and q bit lines ABL1 to ABLq-1 disposed to correspond to q columns so as to deliver information read from the anti-fuses (AFs). Since the fail bit location information table 100 has the anti-fuse array 101, the word lines AWL0 to AWLp-1 and the bit lines ABL0 to ABLq-1 may be driven to randomly access information stored in the anti-fuse array 101.

When the fail bit location information table 100 has the anti-fuse array 101, the word lines AWL0 to AWLp-1 may be connected to gate electrodes of the anti-fuses (AFs), the bit lines ABL0 to ABLq-1 may be connected to first end terminals of the anti-fuses (AFs), and second end terminals of the anti-fuses (AFs) may be connected to a ground (see FIG. 2 for an expanded view of an anti-fuse (AF)). As another example, the gate electrodes of the anti-fuses (AFs) may be connected to a high voltage line (not shown) installed separately from the word lines AWL0 to AWLp-1, and the first ends of the anti-fuses (AFs) may be connected to a selection transistor (not shown). A first end of the selection transistor may be connected to the anti-fuses (AFs), a second end of the selection transistor may be connected to the bit lines ABL0 to ABLq-1, and a gate of the selection transistor may be connected to the word lines AWL0 to AWLp-1.

The fail bit location information table 100 may include a controller 102 to program the location information of defective cells in the anti-fuse array 101 or to read the location information of defective cells from the anti-fuse array 101. The controller 102 may store the location information of defective cells by changing states of the anti-fuses (AFs) by applying voltage signals having different levels to the anti-fuse array 101. The controller 102 may control driving of the word lines AWL0 to AWLp-1 and the bit lines ABL0 to ABLq-1 connected to the anti-fuses (AFs) so as to read information from the anti-fuse array 101.

The fail bit location information table 100 may include a sense amplification unit 103 to sense and amplify the location information of defective cells received from the anti-fuse array 101 and output a result of the amplifying. The fail bit location information table 100 may include a register unit 104 to temporarily store the location information of defective cells received from the sense amplification unit 103. The register unit 104 outputs the location information of defective cells, for example, row address information FRAI and column address information FCAI, to the row address comparison unit 110 and the column address comparison unit 120, respectively. The register unit 104 may include a plurality of register units to separately store and output the row address information FRAI and the column address information FCAI.

The fail bit location information table 100 reads the location information of defective cells from the anti-fuse array 101 when driving of the memory device 1000 starts, and then outputs the location information of defective cells to the row address comparison unit 110 and the column address comparison unit 120. For example, the reading of the location information of defective cells from the anti-fuse array 101 may be performed simultaneously when the memory device 1000 is driven or a desired time after the memory device 1000 is driven.

Figure 3:
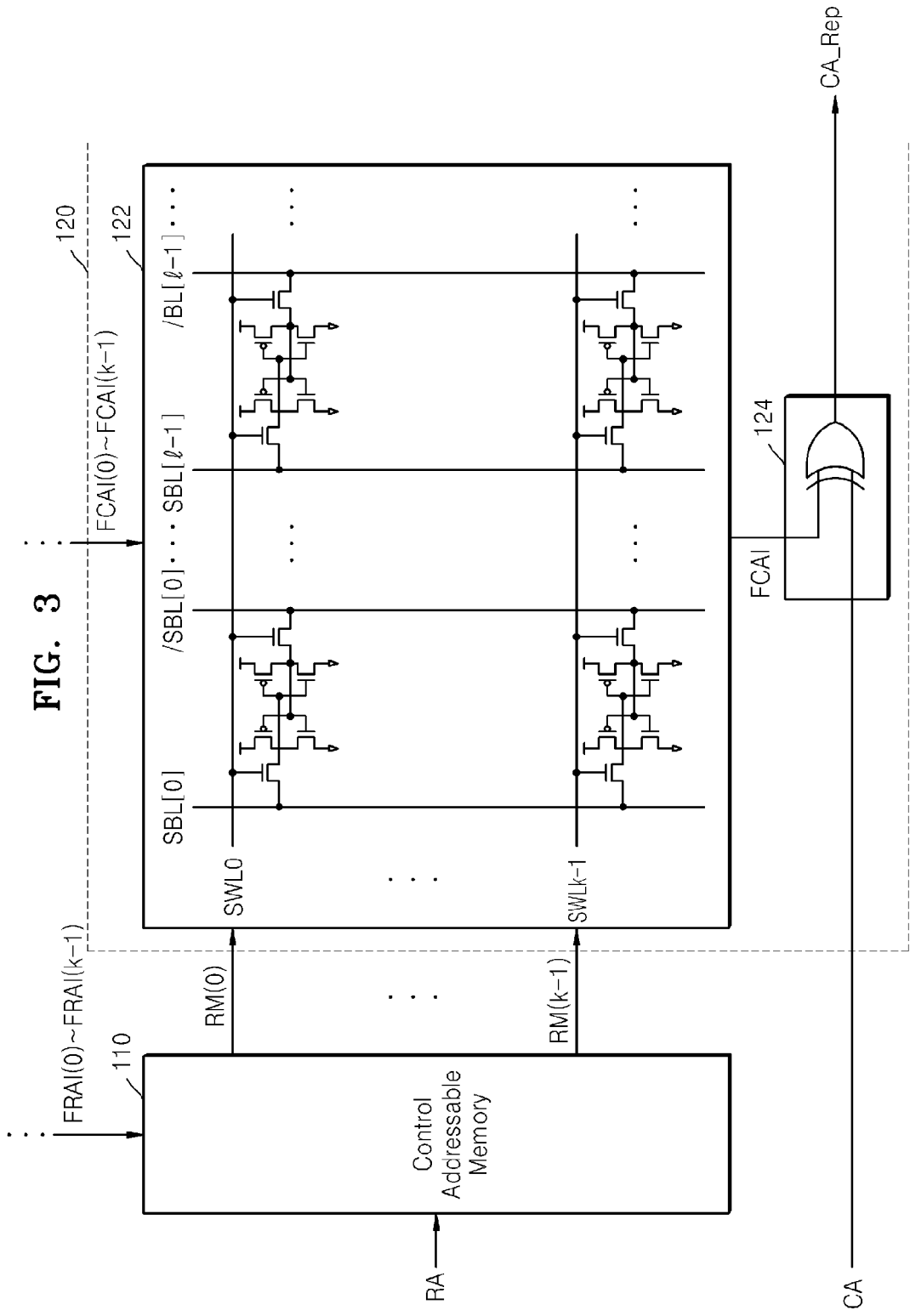
FIG. 3 is a circuit diagram of a row address comparison unit and a column address comparison unit of FIG. 1, according to an example embodiment of the inventive concepts.

FIG. 3 is a circuit diagram of the row address comparison unit 110 and the column address comparison unit 120 of FIG. 1, according to an example embodiment of the inventive concepts. Referring to FIGS. 1 and 3, the row address comparison unit 110 may be a content addressable memory (CAM), for example, a binary CAM (BCAM) or a ternary CAM (TCAM). The row address comparison unit 110 may store row address information FRAI(0) to FRAI(k-1) of defective cells, which are received from the fail bit location information table 100, in a memory space (not shown) thereof. The row address comparison unit 110 compares a row address RA of an access cell received from the outside with the row address information FRAI(0) to FRAI(k-1) of defective cells so as to determine whether there is a defective cell, the row address information of which is the same as the row address RA. The row address RA of the access cell may consist of s bits, and the row address information FRAI(0) to FRAI(k-1) may consist of t bits. Here, 's' and 't' each denote a natural number.

If there is a defective cell, the row address information of which is the same as the row address RA, then the row address comparison unit 110 outputs a row match signal RM corresponding to the row address RA. For example, when a number of rows at which defective cells occur is k, row match signals RM(0) to RM(k-1) corresponding to the k rows may be output. Here, 'k' denotes a natural number. The row match signals RM(0) to RM(k-1) respectively enable word lines SWL0 to SWLk-1 for storing column address information FCAI(0) to FCAI(k-1) of the defective cells in a storage unit 122 of the column address comparison unit 120, which will be described in detail below.

Referring to FIGS. 1 and 3, the storage unit 122 of the column address comparison unit 120 may be a static random access memory (SRAM). The storage unit 122 may have an array of SRM cells connected to intersections of the k word lines SWL0 to SWLk-1, 1 bit lines SBL0 to SBL1-1, and 1 complementary bit lines /SBL0 to /SBL1-1. Here, '1' denotes a natural number. The number of the k word lines SWL0 to SWLk-1 may be equal to the number of rows at which the defective cells occur. The numbers of the 1 bit lines SBL0 to SBL1-1 and the 1 complementary bit lines /SBL0 to /SBL1-1 may be equal to the number of bits of the column address information FCAI(0) to FCAI(k-1) of the defective cells provided from the fail bit location information table 100. If the number of bits of the column address information FCAI(0) to FCAI(k-1) is set to be equal to the number of bits of a column address CA received from the outside, numbers of bit lines SBL and complementary bit lines /SBL may be equal to the number of bits of the column address CA. If multiple defective cells occur at the same row, the number of bit lines SBL and complementary bit lines /SBL may be 2×1 respectively. The SRAM cells may include, for example, CMOS inverters connected in a cross-coupled manner and transistors. In each of the transistors, one end terminal is connected to an input node of one of the CMOS inverters, another end terminal is connected to one of the bit lines SBL0 to SBL1-1 or one of the complementary bit lines /SBL0 to /SBL1-1, and a gate electrode is connected to one of the word lines SWL0 to SWLk-1. The storage unit 122 stores column address information of defective cells occurring at rows of a normal area NA in units of SRAM cells connected to the word lines SWL0 to SWLk-1 of the storage unit 122. Thus, the storage unit 122 may enable word lines SWL0 to SWLk-1 corresponding to the row match signals RM(0) to RM(k-1), according to the row match signals RM(0) to RM(k-1), and the row address comparison unit 110 may thus output column address information FCAI of a defective cell matching the row address RA of the access cell to the comparator 124 of the column address comparison unit 120.

The comparator 124 of the column address comparison unit 120 may be embodied as, for example, an XOR gate. The comparator 124 compares a column address CA of the access cell received from the outside with the column address information FCAI of the defective cell received from the storage unit 122, and outputs a column address replacement signal CA_Rep for repairing the defective cell to the column decoder 30 when the column address CA is the same as the column address information FCAI. The column address replacement signal CA_Rep is set in such a manner that the column decoder 30 may disable the column address CA of the access cell and enable a spare column address SCA.

When at least two defective cells occur in at least one row in the normal area NA of the memory cell array 20, the total number of each of the row address comparison unit 110 and the column address comparison unit 120 illustrated in FIG. 3 may be equal to the number of the at least two defective cells, as will be described in detail with reference to FIG. 5 below.

Figure 4:
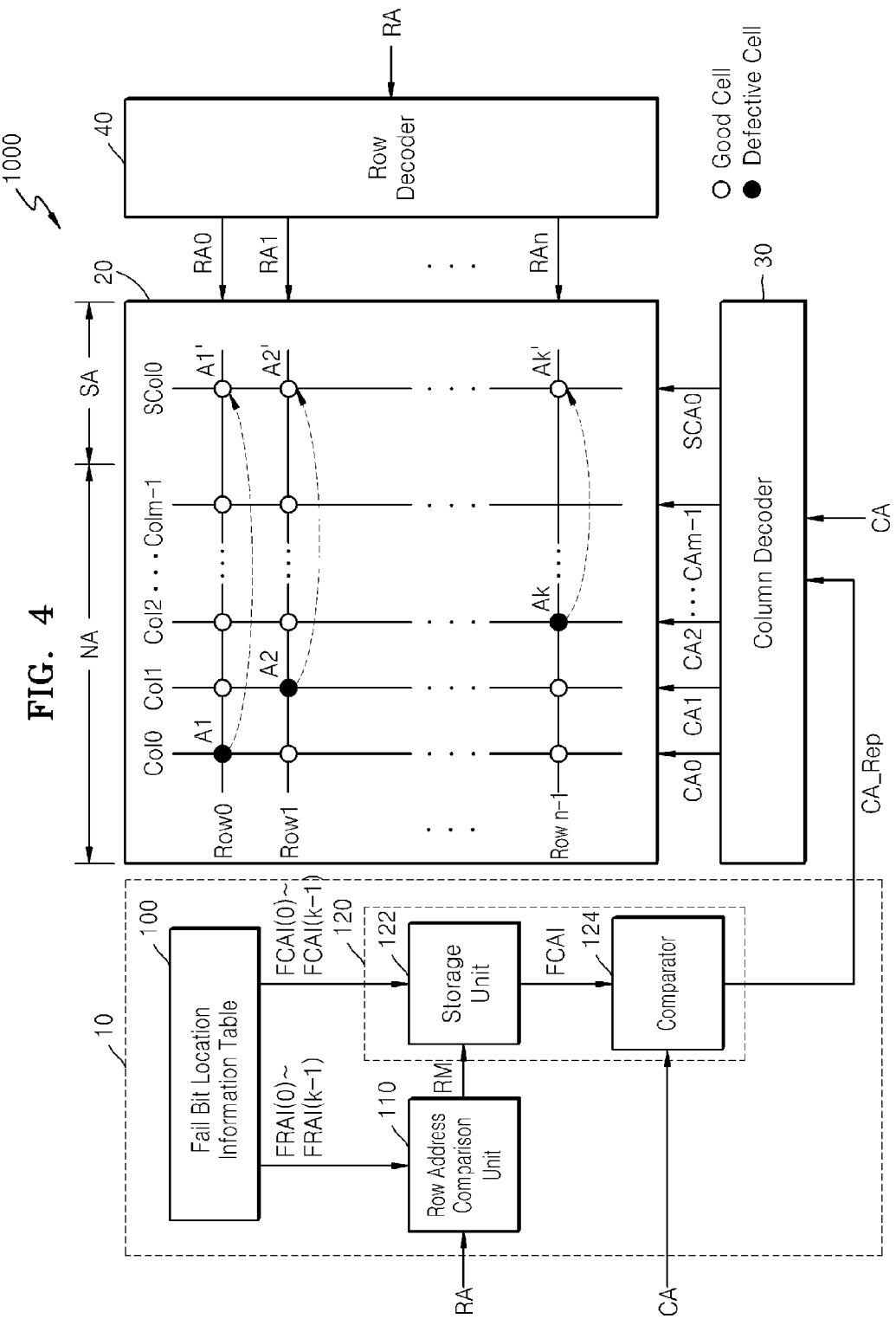
FIG. 4 is a diagram illustrating a method of repairing single defective cell occurring in at least one row in the memory device of FIG. 1, according to an example embodiment of the inventive concepts.

FIG. 4 is a diagram illustrating a method of repairing a single defective cell occurring in at least one row in the memory device 1000 of FIG. 1, according to an example embodiment of the inventive concepts. Referring to FIG. 4, the memory device 1000 further includes a row decoder 40. The row decoder 40 enables a row corresponding to a row address RA of an access cell, according to the row address RA of the access cell. In a memory cell array 20 of FIG. 4, defective cells are denoted by black circles and good cells are denoted by white circles, as will also be shown in FIGS. 5 and 8. It is assumed that in the memory cell array 20 of FIG. 4, one defective cell occurs at each of a plurality of rows Row0 to Rown-1, but no fail may occur at some of the plurality of rows Row0 to Rown-1.

Referring to FIGS. 1 and 4, in the normal area NA of the memory cell array 20, n×m normal cells are connected to intersections of n rows and m columns, respectively. In a spare area SA of the memory cell array 20, n spare cells are disposed. In the normal area NA, one defective cell occurs in at least one row. In the fail bit location information table 100, location information of defective cells A1, A2, . . . , to Ak in the normal area NA has been stored. When the memory device 1000 is driven, the row address comparison unit 110 receives row address information FRAI(0) to FRAI(k-1) of the defective cells A1, A2, . . . , to Ak in the normal area NA of the memory cell array 20 from the fail bit location information table 100. The column address comparison unit 120 receives column address information FCAI(0) to FCAI(k-1) of the defective cells A1, A2, . . . , to Ak from the fail bit location information table 100. To access normal cells in the memory cell array 20, a row address RA and column address CA of an access cell are respectively supplied to the row decoder 40 and the column decoder 30, and the row address RA and column address CA of the access cell are also supplied to the repair circuit 10. The method of repairing a single defective cell according to the current example embodiment will now be described in detail with respect to a case where normal cells corresponding to the first defective cell A1 and the second defective cell A2 from among the defective cells A1, A2, . . . , to Ak are accessed. The normal cells that correspond to the first defective cell A1 and the second defective cell A2 will now be referred to as a 'first access cell' and a 'second access cell,' respectively.

When a row address RA0 of the first access cell is supplied to the row address comparison unit 110, the row address comparison unit 110 compares the row address RA0 of the first access cell with the row address information FRAI(0) to FRAI(k-1) of the defective cells A1, A2, . . . , to Ak. When the first defective cell A1 matches the row address RA0, the row address comparison unit 110 outputs a row match signal RM(0) corresponding to the row address RA0 of the first access cell to the storage unit 122 of the column address comparison unit 120. The storage unit 122 outputs the column address information FCAI(0) of the first defective cell A1 to the comparator 124 according to the row match signal RM(0). The comparator 124 compares a column address CA0 of the first access cell with the column address information FACI(0) of the first defective cell A1. When the column address CA0 of the first access cell is the same as the column address information FACI(0) of the first defective cell A1, the comparator 124 outputs a first column address replacement signal CA_Rep1 to the column decoder 30. The column decoder 30 disables the column address CA0 of the first access cell and enables a first spare column address SCA0 of the spare area SA, according to the first column address replacement signal CA_Rep1. Thus, the first defective cell A1 corresponding to the first access cell is replaced with a first spare cell A1' connected to an intersection of a row Row0 and a first spare column SCo10 in the spare area SA.

When a row address RA1 of the second access cell is supplied to the row address comparison unit 110, the row address comparison unit 110 compares the row address RA1 of the second access cell with the row address information FRAI(0) to FRAI(k-1) of the defective cells A1, A2, . . . , to Ak. When the second defective cell A2 matches the row address RA1, the row address comparison unit 110 outputs a row match signal RM(1) corresponding to the row address RA1 of the second access cell to the storage unit 122 of the column address comparison unit 120. The storage unit 122 outputs the column address information FCAI(1) of the second fail cell A2 to the comparator 124, according to the row match signal RM(1). The comparator 124 compares a received column address CA1 of the second access cell with the column address information FACI(1) of the second defective cell A2. The comparator 124 outputs a first column address replacement signal CA_Rep1 to the column decoder 30 since the column address CA1 of the second access cell is the same as the column address information FACI(1) of the second defective cell A2, similar to the first access cell. The column decoder 30 disables the column address CA2 of the second access cell and enables the first spare column address SCA0, similar to the first access cell, according to the column address replacement signal CA_Rep 1. Thus, the second defective cell A2 corresponding to the second access cell is replaced with a second spare cell A2' connected to an intersection of a row Row1 and the first spare column Sco10 in the spare area SA. In the memory device 1000 according to the current example embodiment, when single defective cells A1 and A2 occurring at different rows are accessed, the defective cells A1 and A2 are replaced with the spare cells A1' and A2' at the same first spare column SCo10 in the spare area SA.

Figure 5:
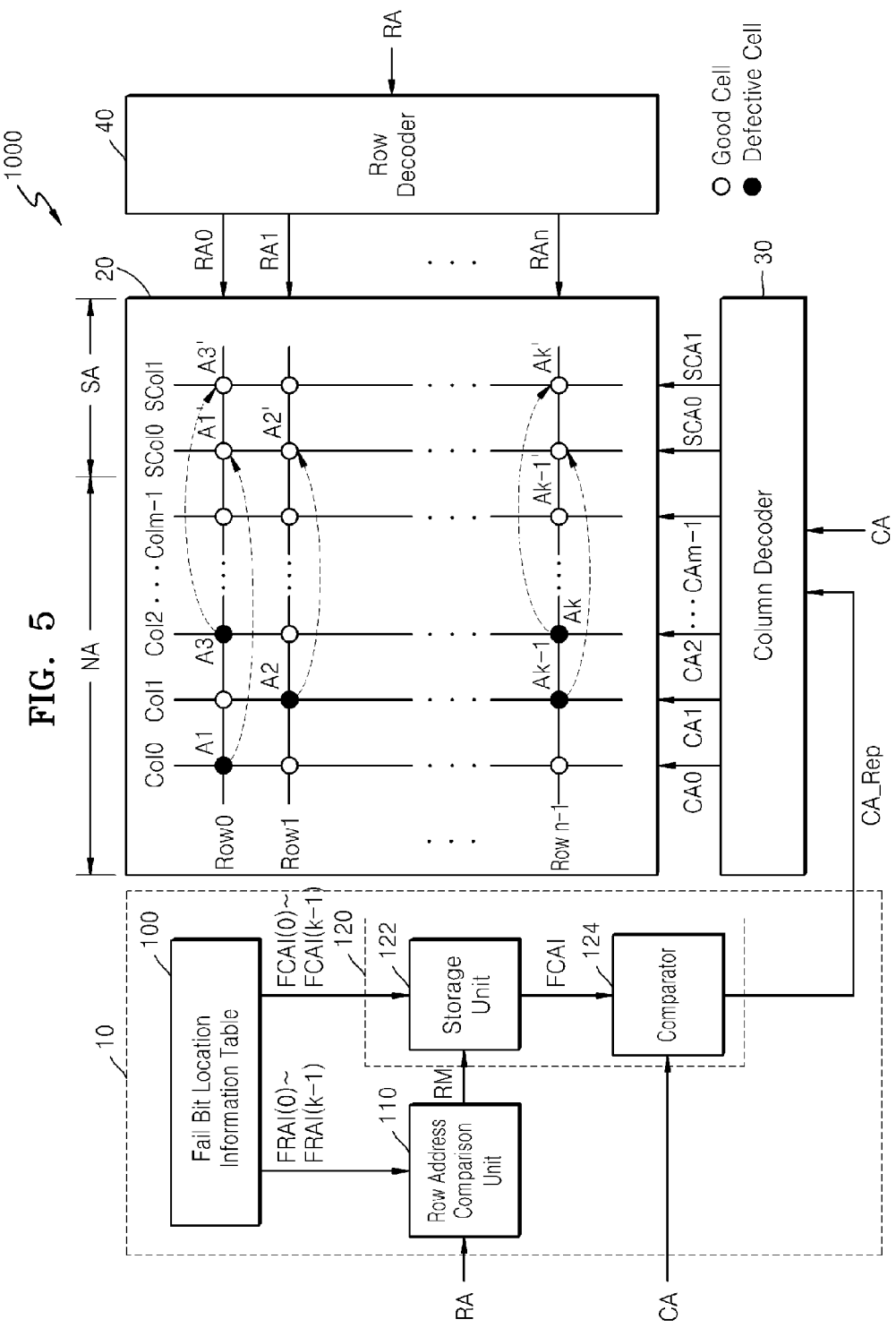
FIG. 5 is a diagram illustrating a method of repairing multiple defective cells occurring in at least one row in the memory device of FIG. 1, according to another example embodiment of the inventive concepts.

FIG. 5 is a diagram illustrating a method of repairing multiple defective cells occurring in at least one row in the memory device 1000 of FIG. 1, according to another example embodiment of the inventive concepts. Structures and operations of the memory device 1000 of FIG. 5 that are the same as those of the memory devices 1000 according to the previous example embodiments are not described again.

Referring to FIG. 5, in a spare area SA of a memory cell array 20, a first spare column SCo10 and a second spare column SCo11 are included. Thus, 2×n spare cells are disposed in the spare area SA of the memory cell array 20. Not only a first defective cell A1 but also a third defective cell A3 occur at a row Row0 of the memory cell array 20. A second defective cell A2 occurs at a row Row1 of the memory cell array 20. The first and second defective cells A1 and A2 are replaced with spare cells A1' and A2' included in a first spare column SCo10, respectively, as described above (see FIG. 4). A method of repairing the third defective cell A3 occurring at the row Row0 will now be described. An access cell corresponding to the third defective cell A3 will be referred to as a 'third access cell'.

When a row address RA0 of the third access cell is supplied to the row address comparison unit 110, the row address comparison unit 110 compares the row address RA0 with row address information FRAI(0) to FRAI(k-1) of defective cells A1, A2, ..., to Ak. When the third defective cell A3 matches the row address RA0, the row address comparison unit 110 outputs a row match signal RM(0) corresponding to the row address RA0 of the third access cell to the storage unit 122 of the column address comparison unit 120. The storage unit 122 outputs column address information FCAI 2 of the third defective cell A3 to the comparator 124 according to the row match signal RM(0). The comparator 124 compares a received column address CA2 of the third access cell with the column address information FACI 2 of the third defective cell A3. If the column address CA2 is the same as the column address information FACI 2, the comparator 124 outputs a second column address replacement signal CA_Rep2 to the column decoder 30. The column decoder 30 disables the column address CA2 of the third access cell and enables a second spare column address SCA1 in the spare area SA, according to the second column address replacement signal CA_Rep2. Thus, the third defective cell A3 corresponding to the third access cell is replaced with a third spare cell A3' connected to an intersection of the row Row0 and the second spare column SCo11 in the spare area SA. When defective cells occur at different rows, for example the first and second defective cells A1 and A2, the first and second defective cells A1 and A2 are respectively replaced with the spare cells A1' and A2' at the first spare column SCo10. When a defective cell occurs at a row already including a defective cell, for example, when the first and third defective cells A1 and A3 occur at the row, the first and third defective cells A1 and A3 are respectively replaced with spare cells A1' and A3' at different spare columns. When a defective cell further occurs at the row Row1 already including a defective cell, the defective cell may be replaced with a spare cell at the second spare column SCo11. Although not shown in FIG. 5, when a defective cell further occurs at the row Row0 including the third defective cell A3, the defective cell may be replaced with a spare cell at a third spare column (not shown) in the spare area SA of the memory cell array 20, similar to the third defective cell A3.

In general, in the above column repair method (or the row repair method), an entire column (or row) including a defective cell is replaced with a spare column (or row). It is inefficient that good cells included in the column (or row) including the defective cell cannot be used. However, in the memory device 1000 according to the current example embodiment, good cells included in a column (or row) including a defective cell may be used by replacing only the defective cell with a corresponding spare cell. Thus, the memory device 1000 may be manufactured to have a large memory capacity since it is possible to easily secure a full memory capacity of the memory device 1000. A size of the memory device 1000 may be minimized since a number of spare columns that may be used to repair defective cells may be minimized. Data reliability may be improved by replacing defective cells with spare cells.

Figure 6:
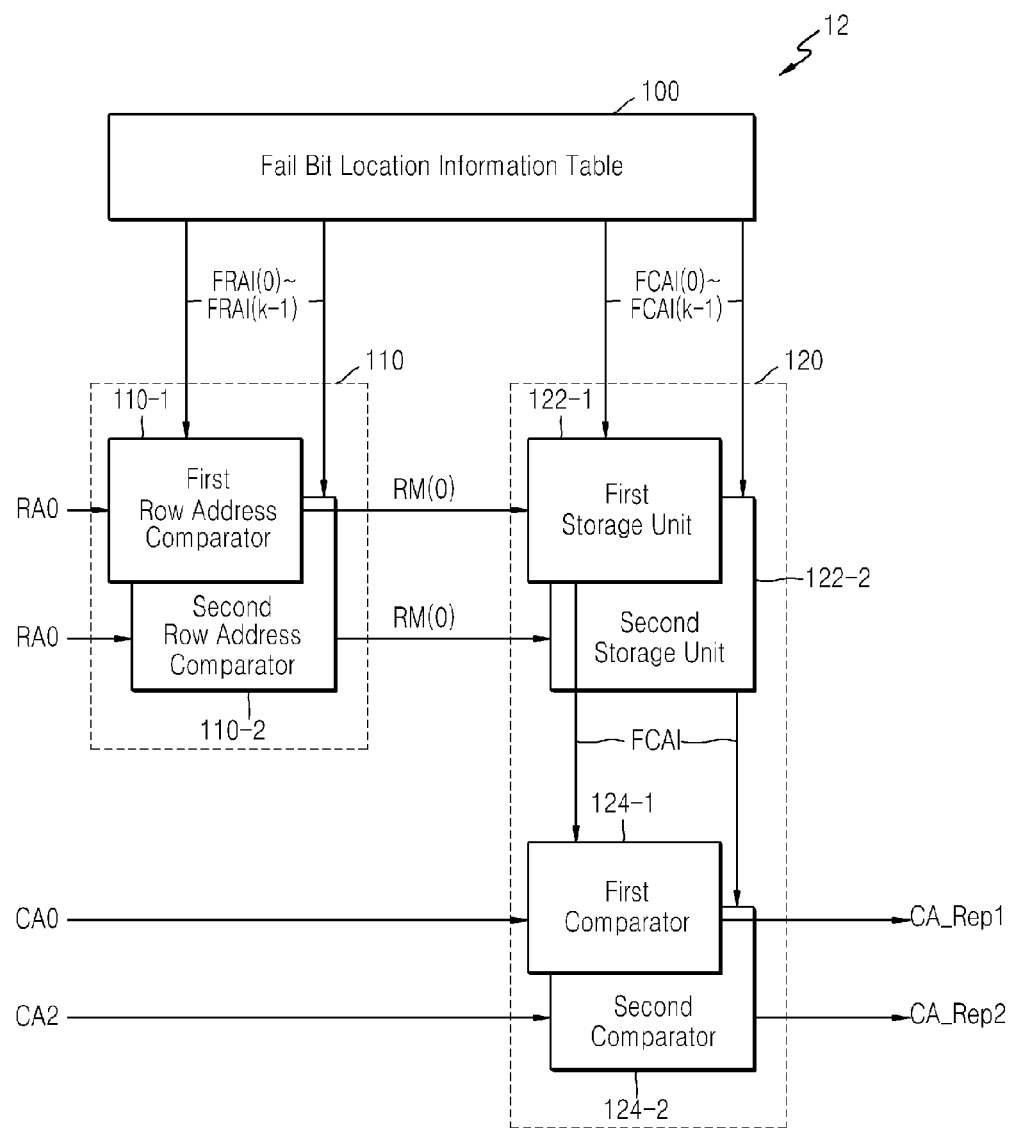
FIG. 6 is a block diagram of a repair circuit according to another example embodiment of the inventive concepts.

FIG. 6 is a block diagram of a repair circuit 12 according to another example embodiment of the inventive concepts. The repair circuit 12 of FIG. 6 is another example of a repair circuit in which multiple defective cells occur in at least one row in the memory device 1000 of FIG. 5. Thus, the repair circuit 12 of FIG. 6 will now be described based on the method of FIG. 5. When the repair circuit 12 of FIG. 6 is described, structures and operations of the repair circuit 12 that are the same as those of the repair circuit 10 of FIG. 5 according to the previous example embodiment are not described again.

Referring to FIGS. 5 and 6, a row address comparison unit 110 may include a first row address comparator 110-1 and a second row address comparator 110-2. A column address comparison unit 120 may include a first storage unit 122-1, a second storage unit 122-2, a first comparator 124-1, and a second comparator 124-2.

The first row address comparator 110-1 and the second row address comparator 110-2 receive row address information FRAI of defective cells from a fail bit location information table 100. The first row address comparator 110-1 may receive a row address RA0 of a first access cell corresponding to a first defective cell A1, and the second row address comparator 110-2 may receive a row address RA0 of a third access cell corresponding to a third defective cell A3. The first row address comparator 110-1 outputs a row match signal RM(0) to the first storage unit 122-1, and the second row address comparator 110-2 outputs a row match signal RM(0) to the second storage unit 122-2.

The first storage unit 122-1 and the second storage unit 122-2 receive column address information FCAI of the defective cells from the fail bit location information table 100. The first storage unit 122-1 may receive column address information of a first defective cell at a row in which multiple defective cells occur and column address information of a defective cell at a row in which a single defective cell occurs from the fail bit location information table 100. The second storage unit 122-2 may receive column address information of a second defective cell at a row in which multiple defective cells occur from the fail bit location information table 100. For example, the first storage unit 122-1 outputs column address information FCAI(0) of the first defective cell A1 to the first comparator 124-1 according to the row match signal RM(0). The second storage unit 122-2 outputs column address information FCAI 2 of the third defective cell A3 to the second comparator 124-2 according to the row match signal RM(0).

The first storage unit 122-1 may receive column address information of a second defective cell at a row in which multiple defective cells occur from the fail bit location information table 100. The second storage unit 122-2 may receive column address information of a first defective cell at a row in which multiple defective cells occur and column address information of a defective cell at a row in which a single defective cell occurs from the fail bit location information table 100. Both the first storage unit 122-1 and the second storage unit 122-2 may receive column address information FCAI of all defective cells.

The first comparator 124-1 compares a received column address CA0 of the first access cell with the column address information FCAI(0) of the first defective cell A1, and outputs a first column address replacement signal CA_Rep1 when the column address CA0 is the same as the column address information FCAI(0). The second comparator 124-2 compares a received column address CA2 of the third access cell with the column address information FCAI 2 of the third defective cell A3, and outputs a second column address replacement signal CA_Rep2 when the column address CA2 is the same as the column address information FCAI 2. Since the row address comparison unit 110 includes the first and second row address comparators 110-1 and 110-2 and the column address comparison unit 120 includes the first and second comparators 124-1 and 124-2, memory spaces of a CAM and an SRAM may be efficiently used and bits of address information of a defective cell and an address received from the outside may be saved when a number of rows including multiple bit defective cells is far less than that of rows including a single bit defective cell. When defective cells further occur at the same row and different columns, a numbers of row address comparison units and column address comparison units corresponding to a number of the defective cells may be added.

FIG. 7 is a block diagram of a memory device 1000 including a repair circuit 14, according to another example embodiment of the inventive concepts. The repair circuit 14 of FIG. 7 includes a fail bit location information table 100, a row address comparison unit 110, and a column address comparison unit 120 and further includes a spare cell repair unit 130, compared to the repair circuit 10 of FIG. 1. Structures and operations of the memory device 1000 of FIG. 7 will be described focusing on the differences with the memory devices 1000 according to the previous example embodiments.

The fail bit location information table 100 may further store location information of at least one defective spare cell occurring in a spare area SA of a memory cell array 20, compared to the fail bit location information tables 100 according to the previous example embodiments. The location information of the at least one defective spare cell may be, for example, row address information FSRAI of the at least one defective spare cell. It will be hereinafter assumed that j defective spare cells occur and the fail bit location information table 100 stores row address information FSRAI (0) to FSRAI(j) of the j defective spare cells. Here, "j" denotes a natural number.

The memory cell array 20 further includes at least one spare row, compared to the memory devices 1000 according to the previous example embodiments. An area where a plurality of spare cells are connected to intersections of the at least one spare row and a plurality of columns is included in the spare area SA.

The spare cell repair unit 130 receives the location information of the at least one defective spare cell from the fail bit location information table 100. The spare cell repair unit 130 replaces a row corresponding to a row address of a defective cell with a spare row. The spare cell repair unit 130 outputs a row address replacement signal RA_Rep to replace the row corresponding to the row address of the defective spare cell with the spare row, before the repair circuit 12 receives a row address RA and column address CA of an access cell corresponding to the defective cell from the outside and then outputs a column address replacement signal CA_Rep.

The row decoder 30 receives the row address replacement signal RA_Rep from the spare cell repair unit 130. The row decoder 40 disables the row address of the access cell and enables a spare row address SRA according to the row address replacement signal RA_Rep. Thus, if a cell that is to be accessed is a defective cell and will thus be replaced with a spare cell, the spare cell may be replaced with another spare cell even when the spare cell is a defective spare cell.

In general, fail bits occurring in a spare cell are caused when the memory device 1000 is packaged. A defective cell may occur in the spare area SA of the memory cell array 20 due to thermal and chemical treatments performed during a package process. The repair circuit 14 may perform a post-package repair (PPR), since the fail bit location information table 100 may further store location information of a defective spare cell after the package process and the spare cell repair unit 130 may replace a row corresponding to a row address of the defective spare cell with a spare row, according to the location information of the defective spare cell.

Figure 8:
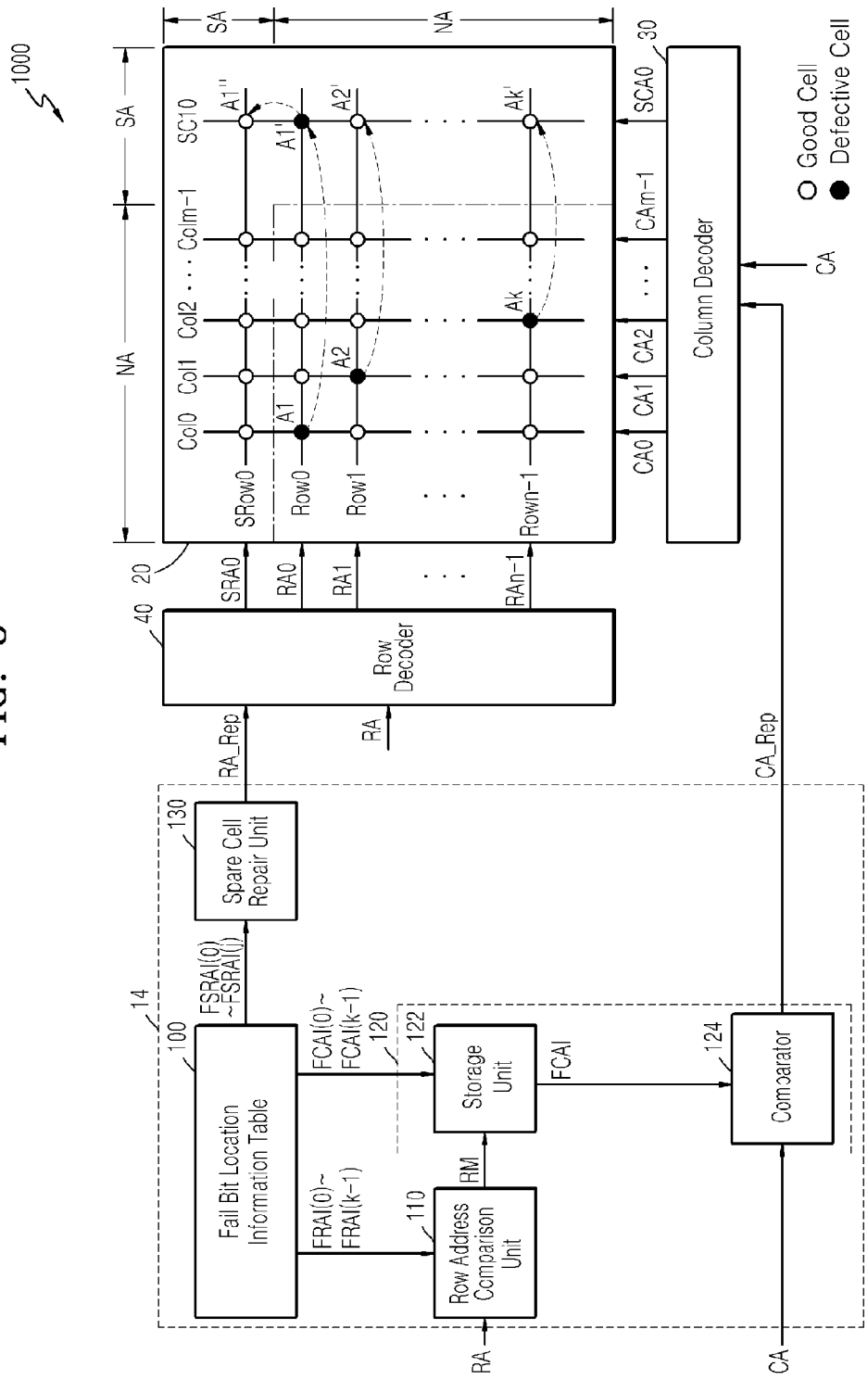
FIG. 8 is a diagram illustrating a method of repairing a defective spare cell in the memory device of FIG. 7, according to another example embodiment of the inventive concepts.

FIG. 8 is a diagram illustrating a method of repairing a defective spare cell in the memory device 1000 of FIG. 7, according to another example embodiment of the inventive concepts. Referring to FIG. 8, the memory cell array 20 is illustrated as including one spare row and one spare column in the spare area SA. The method of FIG. 8 will now be described based on the method of FIG. 4, in which a defective cell is repaired when a single defective cell occurs in at least one row.

Referring to FIGS. 4, 7, and 8, a first access cell corresponds to a first defective cell A1, and the first defective cell A1 is thus replaced with a first spare cell A1' in the spare area SA. However, when the first spare cell A1' is a defective spare cell having fail bits, a spare cell repair unit 130 replaces a row RA0 including the first spare cell A1' with another spare row SRA0, thereby replacing the first defective cell A1 with a spare cell A1'.

Whether the first spare cell A1' is a defective spare cell may be determined by testing whether a fail bit occurs in the memory device 1000, and location information of the first spare cell may be stored in a fail bit location information table 100. The spare cell repair unit 130 receives row address information FSRAI(0) of the first spare cell A1' from the fail bit location information table 100, and outputs a row address replacement signal RA_Rep to a row decoder 40. The row decoder 40 disables a row address RA0 of the first spare cell A1' and enables a spare row address SRA0, according to the row address replacement signal RA_Rep. Thus, the row RA0 including the first spare cell A1' is replaced with a spare row SRow0 corresponding to the spare row address SRA0.

Since the first access cell corresponds to the first defective cell A1, a repair circuit 14 outputs a first column address replacement signal CA_Rep1. A column decoder 30 disables a column address CA0 of the first access cell and enables a first spare column address SCA0, according to the first column address replacement signal CA_Rep1. Thus, the first defective cell A1 corresponding to the first access cell is replaced with the spare cell A1' connected to an intersection of the spare row SRow0 and a first spare column SCo10 in the spare area SA.

As described above, defective cells occurring in the spare area SA of the memory cell array 20 may also be efficiently repaired by using the repair circuit 14 according to the current example embodiment. The repair circuit 14 according to the current example embodiment may perform a post-package repair (PPR) to repair fail bits occurring in the spare area SA that does not have any defective cell, caused when a package process is performed.

When a spare cell other than the first spare cell A1' from among spare cells at the first spare column SCo10 is a defective spare cell, the defective spare cell is replaced with a good spare cell by replacing a row including the defective spare cell with a spare row (not shown) other than the spare row SRow0, according to the method of repairing a spare cell.

According to the method of repairing a spare cell, when not only the first spare column SCo10 but also a second spare column SCo11 are included in the spare area SA, defective spare cells occurring at the same row and the first spare column SCo10 and the second spare column SCo11 may be replaced with good spare cells included at the spare row SRow0, similar to a case described above with reference to the FIG. 5, in which multiple defective cells occur in at least one row.

Figure 9A:
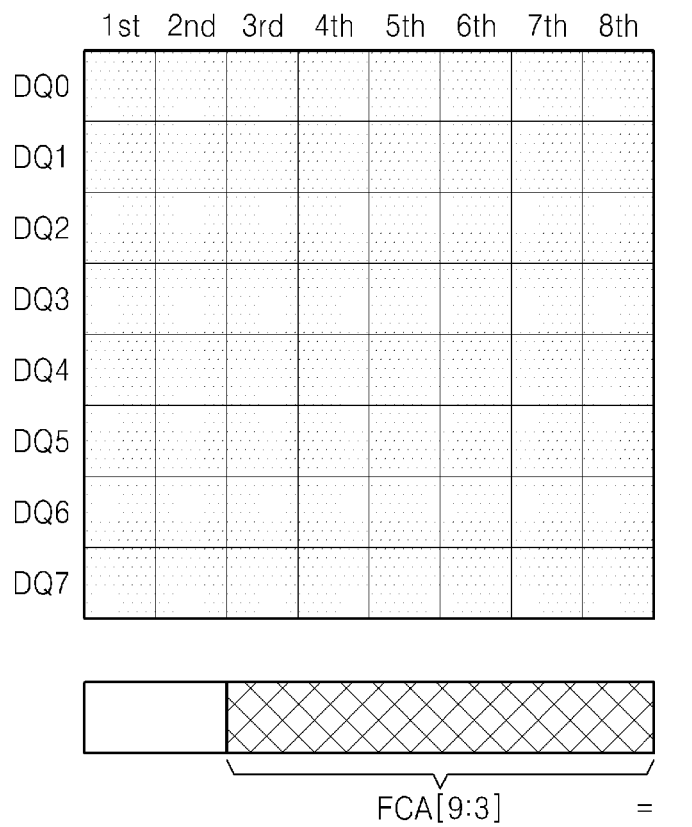
FIGS. 9A to 9C are diagrams illustrating units in which the repair circuit of the memory device of FIG. 1 performs repairing, according to example embodiments of the inventive concepts.
Figure 9B:
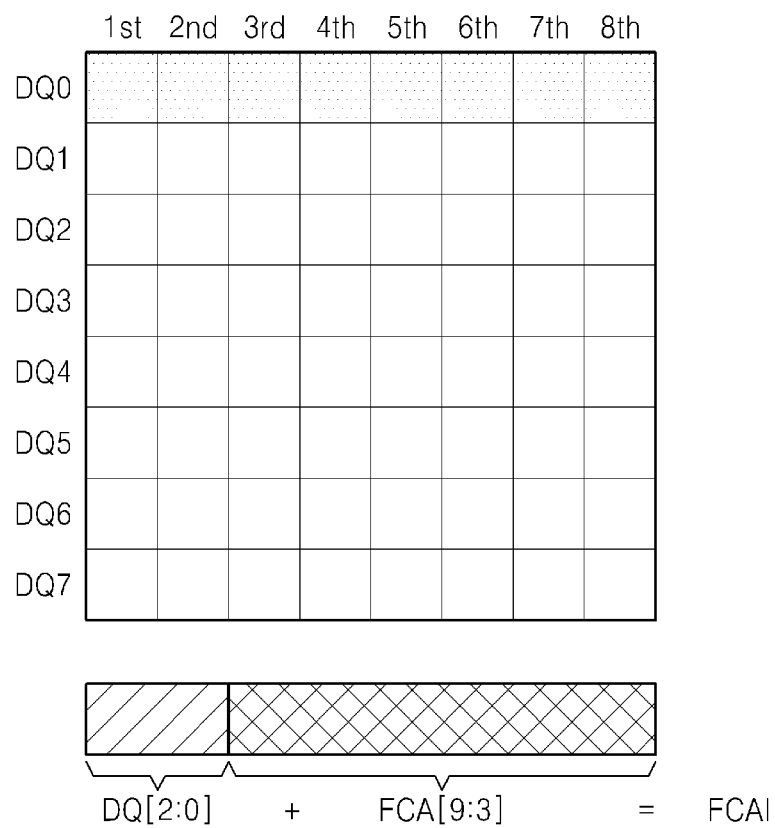
Figure 9C:
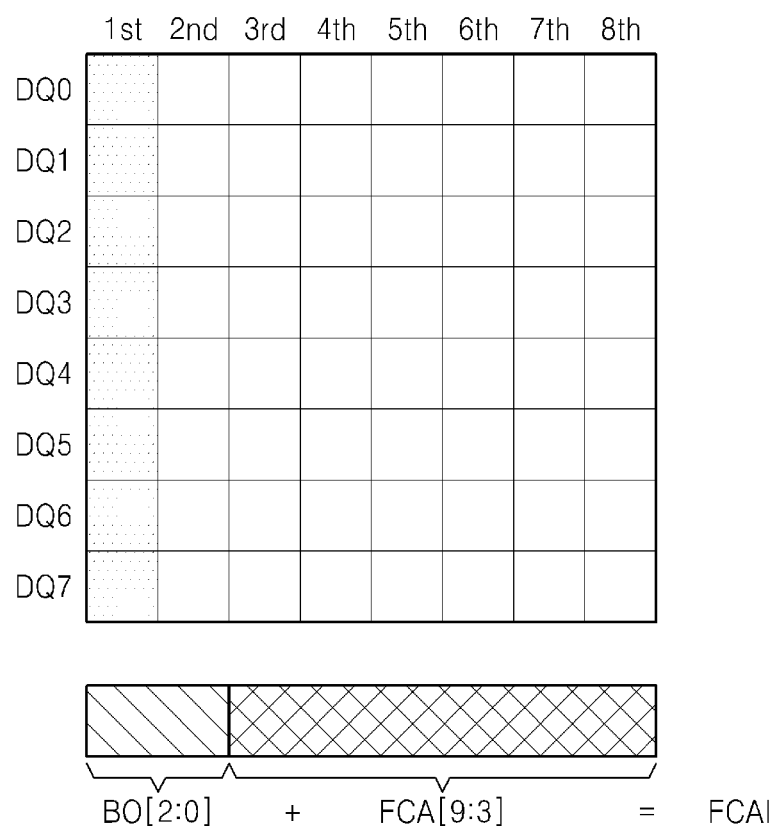

FIGS. 9A to 9C are diagrams illustrating a unit in which the repair circuit 10 of the memory device 1000 of FIG. 1 performs repairing, according to example embodiments of the inventive concepts. The memory device 1000 transmits data DQ, which is written to or read from the memory cell array 20, to or receives the data DQ from a memory controller (not shown). According to the design of the memory device 1000, a unit in which the data DQ is written and read may be set to be bits corresponding to a desired burst length. Thus, the data DQ may be read and written on a basis of a block having a size corresponding to the burst length, and addressing may also be performed on a basis of the block to access memory cells which the data DQ is to be written to or read from. Thus, when the data DQ includes fail bits and a defective cell causing the fail bits is repaired, the defective cell may be repaired on a basis of the block. When a memory cell from among memory cells constituting a block is a defective cell, the defective cell may be repaired in units of all the memory cells constituting the block. In this case, the larger the block is, the more good bits are needed to repair a single fail bit. Thus, there is a need to variably set a size of a block as a unit in which repairing is performed so that a fail bit may be efficiently repaired.

DQ information and burst order information may be used to adjust a unit in which repairing is performed. Bits that constitute the data DQ are mapped to input/output (I/O) DQ pads according to the DQ information. The I/O DQ pads for cells of the memory cell array 20 corresponding to the data DQ are determined based on the DQ information. The bits that constitute the data DQ are sequentially transmitted/received via the I/O DQ pads according to the burst order information. An order that the data DQ is input to or output from cells of the memory cell array 20 via the I/O DQ pads is determined according to the burst order information. Thus, if the repair circuit 10 according to an example embodiment of the inventive concepts uses the DQ information or the burst order information as a comparison target, the size of the block including the defective cell causing the fail bits may be adjusted even when the burst length is fixed. If the DQ information or the burst order information is also considered when the repair circuit 10 compares column address information FCAI of the defective cell with a column address CA of an access cell, a unit in which the repair circuit 10 performs repairing on the defective cell may be adjusted, thereby more efficiently repairing the fail bits.

In FIGS. 9A to 9C, it is assumed that in the memory device 1000, the bits constituting the data DQ is X8, for example, a burst length is '8', the data DQ is transmitted and received via eight DA pads corresponding to the burst length '8', and memory cells are accessed and repaired on a basis of the block. It is assumed that a fail block consists of memory cells including a single defective cell. A unit in which the repair circuit 10 performs repairing will now be described on an assumption that a column address CA of an access block is 7 bits long (CA[9:3]). However, the inventive concepts are not limited thereto and bits of the data DQ and the number of DQ pads may be X2, X4, X16, X32, or the like. The column address CA of the access block is not limited thereto and may be, for example, r-bits long. Here, 'r' denotes a natural number.

Referring to FIGS. 1 and 9A, column address information FCAI of fail block may be set to have only a 7-bit column address. For example, the column address information FCAI may be set only to 'FCA[9:3]'. In this case, only 'CA[9:3]' may be used as a column address CA of an access block, since the DQ information and the burst order information are not used when the column address CA is compared with the column address information FCAI. Thus, a unit in which the repair circuit 10 performs repairing on the fail block may be 64 bits of data, pieces of which each have a burst length '8' and are output via eight DQ pads.

Referring to FIGS. 1 and 9B, column address information FCAI of a fail block may include a 7-bit column address and 3-bit DQ information DQ[x:y]. Here, 'x' and 'y' each denote an integer greater than '0'. For example, the column address information FCAI of the fail block may be set to be 'FCA[9:3]' and 'DQ[2:0]'. In this case, not only 'CA[9:3]' but also the DQ information may be added to the column address CA to be compared with column address information FCAI of a fail block. Since the DQ information DQ[2:0] is used in comparing the column address CA with the column address information FCAI, the repair circuit 10 may repair the fail block in units of data output via DQ pads. Thus, a unit in which the repair circuit 10 repairs the fail block may be 8 bits of data output via the DQ pads.

Referring to FIGS. 1 and 9C, column address information FCAI of a fail block may include a 7-bit column address and 3-bit burst order information BO[z:w]. Here, 'z' and 'w each denote an integer greater than '0'. For example, the column address FCAI of the fail block may be set to be FCA[9:3]' and 'BO[2:0]'. In this case, not only CA[9:3] but also the burst order information BO[2:0] may be added to a column address CA of an access block to be compared with the column address information FCAI of the fail block. Since the burst order information BO[2:0] is used in comparing the column address CA with the column address information FCAI, the repair circuit 10 may repair the fail block in units of data output according to a burst order. Thus, a unit in which the repair circuit 10 repairs the fail block may be 8 bits of data output via DQ pads according to a burst order.

As described above, in the repair circuit 10, location information of a defective cell, DQ information about a block that is a unit in which accessing and repairing are performed, burst order information, and so on may be stored in the fail bit location information table 100, and are used in comparing a column address of an access cell with column address information of a defective cell. Thus, it is possible to adjust a unit in which the repair circuit 10 performs repairing. Accordingly, a unit in which the repair circuit 10 performs repairing may be finely adjusted, thereby efficiently repairing a defective cell.

Figure 10:
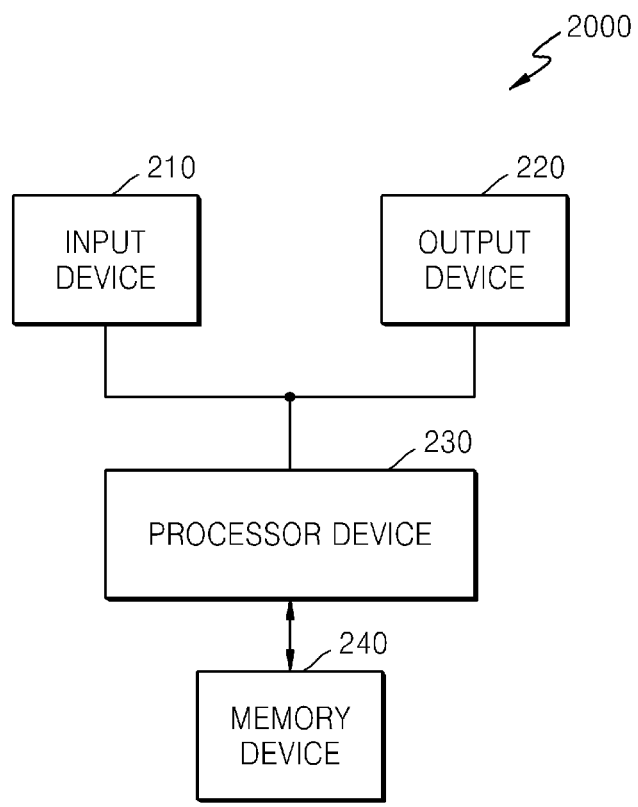
FIG. 10 is a block diagram of an electronic system including the memory device of FIG. 1, according to an example embodiment of the inventive concepts.

FIG. 10 is a block diagram of an electronic system 2000 including the memory device 1000 of FIG. 1, according to an example embodiment of the inventive concepts. Referring to FIG. 10, the electronic system 2000 includes an input device 210, an output device 220, a processor device 230, and a memory device 240. The processor device 230 may control the input device 210, the output device 220, and the memory device 240 via corresponding interfaces. Although not shown, the processor device 230 may include at least one device from among at least one microprocessor, a digital signal processor, a microcontroller, and logic devices capable of performing operations similar to these devices. The input device 210 and the output device 220 may include at least one selected device from among a keypad, a keyboard, and a display device.

The memory device 240 may be the memory device 1000 including the repair circuit 10 of FIG. 1 or the repair circuit 14 of FIG. 7. Thus, the electronic system 2000 may be compact and may improve data reliability.

Figure 11:
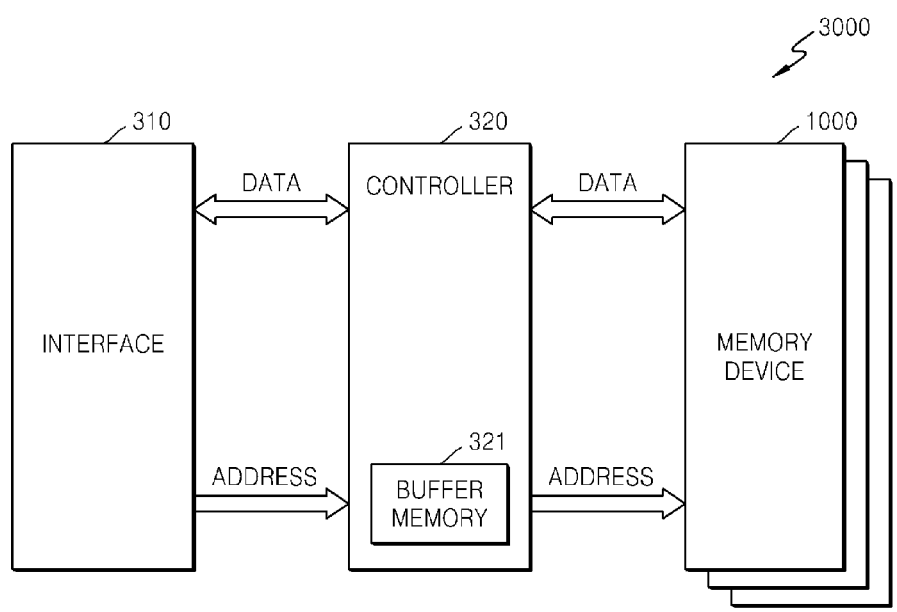
FIG. 11 is a block diagram of a memory system including the memory device of FIG. 1, according to an example embodiment of the inventive concepts.

FIG. 11 is a block diagram of a memory system 3000 including the memory device 1000 of FIG. 1, according to an example embodiment of the inventive concepts. Referring to FIG. 11, the memory system 3000 may include an interface unit 10, a controller 320, and a memory device 1000. The memory device 1000 may be the same as the memory device 1000 of FIG. 1. The interface unit 310 may provide an interface between the memory system 3000 and a host (not shown). The interface unit 310 may include a data exchange protocol corresponding to the host so as to interface with the host. The interface unit 310 may be constructed to communicate with the host by using one of various protocols, for example, a universal serial bus (USB), a multi-media card (MMC), a peripheral component interconnect express (PCI-E), a serial advanced technology attachment (SATA), a parallel advanced technology attachment (PATA), a small computer system interface (SCSI), a serial-attached SCSI (SAS), an enhanced small device interface (ESDI), and an integrated drive electronics (IDE).

The controller 320 may receive data and an address from the outside via the interface unit 310. The controller 320 may access the memory device 1000, based on data and an address received from the host. The controller 320 may transmit data DATA read from the memory device 1000 to the host via the interface unit 310.

The controller 320 may include a buffer memory 321. The buffer memory 321 temporarily stores write data received from the host or the data DATA read from the memory device 1000. If data present in the memory device 1000 is cached when a request to perform a read command is received from the host, the buffer memory 421 supports a cache function of directly providing the cached data to the host. In general, a data transmission speed according to a bus format of the host, for example, a SATA or a SAS, may be far higher than that of a memory channel in the memory system 3000. When an interfacing speed of the host is much higher than that of the memory channel, the buffer memory 321 may be used to minimize degradation in the performance of the memory system 4000 caused by such a speed difference.

The memory device 1000 may be used as a storage medium of the memory system 3000. The memory device 1000 may include a volatile memory device, for example, DRAM, DDR-SDRAM, etc. The memory device 1000 may include the repair circuit 10 of FIG. 1 according to an example embodiment of the inventive concepts. The memory device 1000 may include the repair circuit 12 or 14 of FIG. 6 or 7, according to another example embodiment of the inventive concepts. Thus, the memory system 3000 may be compact and may improve data reliability.

The memory system 3000 of FIG. 11 may be installed in an information processing apparatus, for example, a personal digital assistant (PDA), a portable computer, a web tablet, a digital camera, a portable media player (PMP), a mobile phone, a wireless phone, or a laptop computer. The memory system 3000 may be a MMC card, a secure digital (SD) card, a micro SD card, a memory stick, an identification (ID) card, a personal computer memory card international association (PCMCIA) card, a chip card, a USB card, a smart card, a compact flash (CF) card, or the like.

Figure 12:
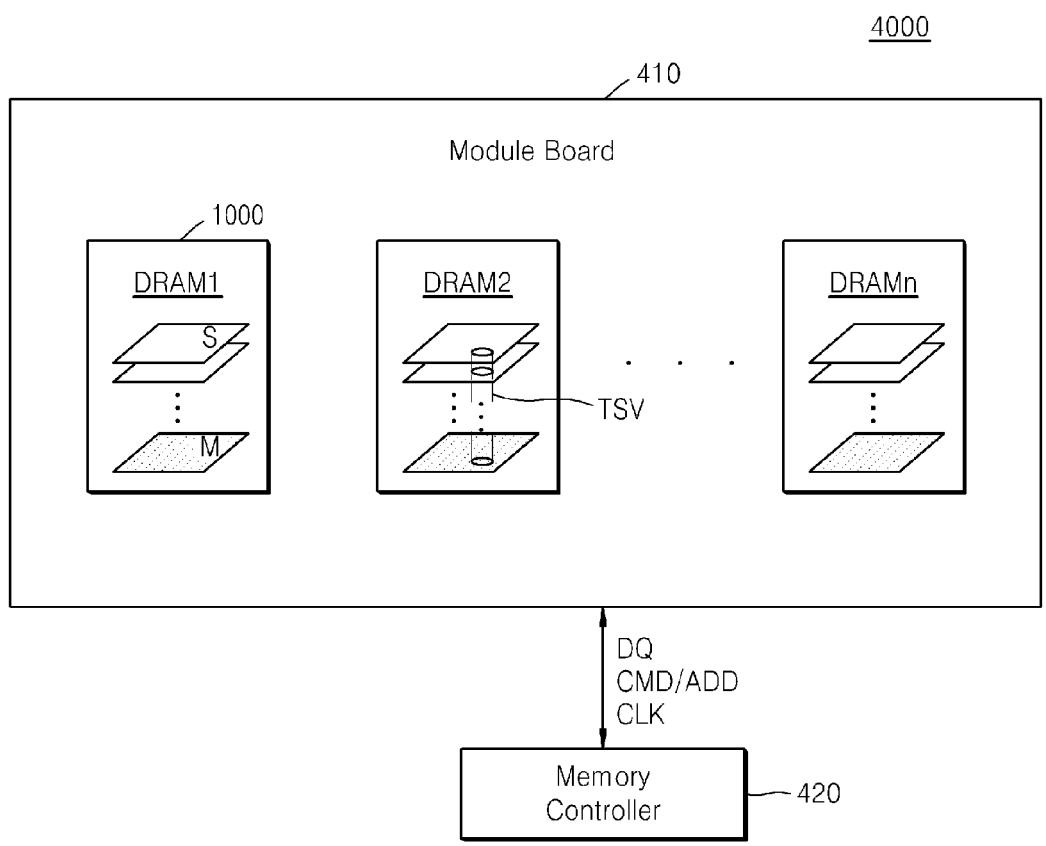
FIG. 12 is a diagram of a memory system to which the memory device of FIG. 1 is applied, according to another example embodiment of the inventive concepts.

FIG. 12 is a diagram of a memory system 4000 to which the memory device 1000 of FIG. 1 is applied, according to another example embodiment of the inventive concepts. Referring to FIG. 12, the memory system 4000 may include a memory module 410 and a memory controller 420. In the memory module 410, at least one memory device 1000 may be mounted on a module board. The at least one memory device 1000 may be embodied as a DRAM chip, and each of the at least one memory device 1000 may include a plurality of semiconductor layers. The semiconductor layers may include at least one master chip M and at least one slave chip S.

Each of the at least one memory device 1000 may include a repair circuit according to an example embodiment of the inventive concepts. The repair circuit may be one of the repair circuits 10, 12, and 14 according to the previous example embodiments. The repair circuit may be included in one of or each of the plurality of semiconductor layers. Thus, the memory system 4000 may be compact and may improve data reliability.

Signals may be transmitted between the plurality of semiconductor layers via through silicon vias (TSVs). Although the current example embodiment describes a structure in which signals are transmitted between the plurality of semiconductor layers via TSVs, the inventive concepts are not limited thereto and a structure in which the plurality of semiconductor layers are stacked through wire bonding or a tape including an interposer wire may be applied.

Signals may be transmitted between the plurality of semiconductor layers through an optical I/O connection. For example, signals may be transmitted between the plurality of semiconductor layers according to a radiative method using radio-frequency (RF) waves or ultrasonic waves, an inductive coupling method using magnetic induction, or non-radiative method using magnetic field resonance.

In the radiative method, a signal is transmitted wirelessly by using a monopole antenna or a planar inverted-F antenna (PIFA). Radiation is generated when electric fields or magnetic fields that vary over time influence each other. A signal may be received via an antenna having the same frequency, in accordance with polarization characteristics of incident waves.

In the inductive coupling method, a strong magnetic field is generated in one direction by winding a coil several times, and the coil that resonates at a similar frequency is attracted and thus coupling is generated.

The non-radiative method uses evanescent wave coupling that moves electromagnetic waves between two media that resonate at the same frequency through a near distance electromagnetic field.

The memory module 410 may communicate with the memory controller 420 via a system bus (not shown). The system bus may be used to exchange data DQ, a command/address CMD/ADD, a clock signal CLK, etc. between the memory module 410 and the memory controller 420.

Figure 13:
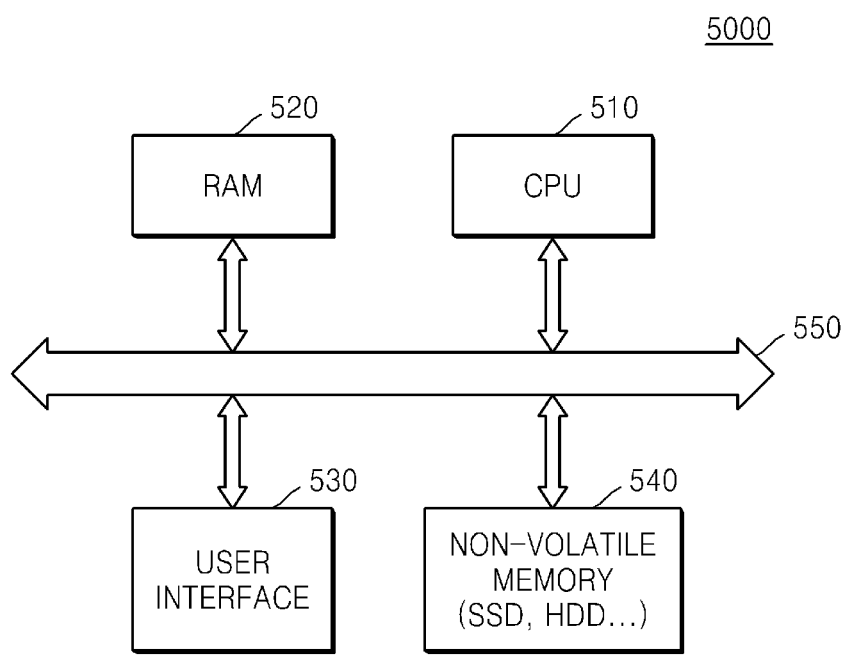
FIG. 13 is a block diagram of a computing system including a memory device, according to an example embodiment of the inventive concepts.

FIG. 13 is a block diagram of a computing system 5000 including a memory device, according to an example embodiment of the inventive concepts. Referring to FIG. 13, a RAM 520 which is a memory device according to an example embodiment of the inventive concepts may be installed in the computing system 5000, for example, a mobile device or a desktop computer. The RAM 520, which is a memory device according to an example embodiment of the inventive concepts, may be the memory device 1000 according to one of the previous example embodiments. For example, the RAM 520 may be the memory device 1000 including the repair circuit 10 illustrated in FIG. 1 or may be a memory module. Thus, the computing system 5000 may be compact and may improve data reliability. The RAM 520 may be understood as a concept including a memory device and a memory controller.

The computing system 5000 according to an example embodiment of the inventive concepts includes a central processing unit (CPU) 510, the RAM 520, a user interface 530, and a nonvolatile memory 540 that are electrically connected via a bus 550. The nonvolatile memory 540 may be a large-capacity storage device, e.g., a solid state disk (SSD) or a hard disc drive (HDD).

When the computing system 5000 is applied to a mobile device, a battery (not shown) may be additionally provided to supply power supply voltage to the computing system 5000. Although not shown, the computing system 5000 may further include an application chipset, a camera image processor (CIP), an I/O device, and so on.

While the inventive concepts have been particularly shown and described with reference to example embodiments thereof, it will be understood that various changes in form and details may be made therein without departing from the spirit and scope of the following claims.

What is claimed is:

1. A memory device including a repair circuit, the repair circuit comprising:
    a fail bit location information table configured to store row address information and column address information of at least one defective cell in a normal area of a memory cell array;
    a row address comparison unit configured to store the row address information of the at least one defective cell, the row address information provided from the fail bit location information table, compare the row address information of the at least one defective cell with a row address of a first access cell, and output a first row match signal when the row address of the first access cell matches a row address in the row address information of the at least one defective cell;
    a column address comparison unit configured to store the column address information of the at least one defective cell, the column address information provided from the fail bit location information table, output a column address of a first defective cell from among the column address information of the at least one defective cell according to the first row match signal, compare the column address of the first defective cell with a column address of the first access cell, and output a first column address replacement signal for repairing the first access cell when the column address of the first defective cell is the same as the column address of the first access cell;
    a column decoder configured to disable the column address of the first access cell and enable a column address of a first spare cell according to the first column address replacement signal; and
    a row decoder configured to enable the first access cell according to the row address of the first access cell,
    wherein the repair circuit is configured to replace the first defective cell in the normal area of the memory cell array with the first spare cell in a spare area of the memory cell array, the first spare cell connected to an intersection of a row corresponding to the row address of the first access cell and a column corresponding to a first spare column, the spare area of the memory cell array disposed separately arranged from the normal area of the memory cell array.

2. The memory device of claim 1, wherein the row address comparison unit is configured to compare a row address of a second access cell, which is different from the row address of the first access cell, with the row address information of the at least one defective cell, and then to output a second row match signal when the row address of the second access cell matches a row address in the row address information of the at least one defective cell, and
    the column address comparison unit is configured to output a column address of a second defective cell from among the column address information of the at least one defective cell according to the second row match signal, to compare the column address of the second defective cell with a column address of the second access cell, and output the second column address replacement signal when the column address of the second defective cell is the same as the column address of the second access cell,
    the row decoder is configured to enable the row address of the second access cell according to the row address of the second access cell, and
    wherein the repair circuit is configured to replace the second defective cell in the normal area of the memory array with a second spare cell in the spare area of the memory cell array, the second spare cell connected to an intersection of a row corresponding to the row address of the second access cell and the first spare column.

3. The memory device of claim 1, wherein the row address comparison unit is configured to compare the row address information of the at least one defective cell with a row address of a third access cell, which has a row address that is the same as the row address of the first access cell and a column address that is different from the column address of the first access cell, and output a third row match signal when the row address of the third access cell matches a row address in the row address information of the at least one defective cell,
    the column address comparison unit is configured to output a column address of a third defective cell from among the column address information of the at least one defective cell according to the third row match signal, compare the column address of the third defective cell with a column address of the third access cell, and output a second column address replacement signal for replacing the third defective cell when the column address of the third defective cell is the same as the column address of the third access cell,
    the column decoder is configured to disable the column address of the third access cell and enable a second spare column, according to the second column address replacement signal received from the column address comparison unit, and wherein the repair circuit is configured to replace the third defective cell in the normal area of the memory cell array with a third spare cell in the spare area of the memory cell array, the third space cell connected to an intersection of a row corresponding to the row address of the third access cell and the second spare column.

4. The memory device of claim 1, wherein the fail bit location information table is further configured to store row address information and column address information of at least one defective spare cell occurring in the spare area of the memory cell array disposed separately from the normal area of the memory cell array, and wherein the memory device further comprises a spare cell repair unit configured to output a row address replacement signal for disabling a row address of the at least one defective spare cell and enabling a spare row address, according to the row address information of the at least one defective spare cell stored in the fail bit location information table.

5. The memory device of claim 4, wherein, before the repair circuit receives the row address and column address of the first access cell and replaces the first defective cell with the first spare cell, the spare cell repair unit is configured to outputs the row address replacement signal.

6. The memory device of claim 1, wherein the fail bit location information table is configured to store the row address information and column address information of the at least one defective cell by using an anti-fuse.

7. The memory device of claim 1, wherein the row address comparison unit comprises a content addressable memory (CAM).

8. The memory device of claim 1, wherein the column address comparison unit comprises:
   a storage unit configured to store the column address information of the at least one defective cell, and output the column address information of the first defective cell, according to the first row match signal; and
   a comparator configured to compare the column address information of the first defective cell received from the storage unit with the column address of the first access cell, and output the first column address replacement signal when the column address of the first defective cell is the same as the column address of the first access cell.

9. The memory device of claim 8, wherein the storage unit comprises a static random access memory (SRAM).

10. The memory device of claim 8, wherein the comparator comprises an XOR gate.

11. The memory device of claim 1, wherein the memory device is configured to repair the at least one defective cell on a basis of a fail block including the at least one defective cell.

12. The memory device of claim 11, wherein the column address information of the at least one defective cell and the column address of the first access cell comprise at least one of DQ information and burst order information regarding data output from the memory cell array.

13. A method of repairing a memory device, the method comprising:
   enabling, using a row decoder, a first access cell according to a row address of the first access cell;
   reading and storing into a fail bit location information table row address information and column address information of at least one defective cell occurring in a normal area of a memory cell array;
   storing in a row address comparison unit the row address information of the at least one defective cell provided from the fail bit location information table, and storing in a column address comparison unit the column address information of the at least one defective cell provided from the fail bit location information table;
   comparing, by using the row address comparison unit, the row address of the first access cell with the row address information of the at least one defective cell;
   when the row address of the first access cell matches a row address in the row address information of the at least one defective cell stored in the row address comparison unit, comparing, by using the column address comparison unit, a column address of the first access cell with the column address information of the at least one defective cell stored in the row address comparison unit; and
   when the column address of the first access cell is the same as a column address of one of the at least one defective cell, replacing the first access cell with a first spare cell included in a spare area of the memory cell array disposed separately from the normal area of the memory cell array, wherein the replacing includes,
      disabling, using a column decoder, the column address of the first access cell; and
      enabling a column address of the first spare cell according to the first column address replacement signal.

14. The method of claim 13, further comprising:
comparing a row address of a second access cell with the row address information of the at least one defective cell;
when the row address of the second access cell matches a row address in the row address information of the at least one defective cell, comparing a column address of the second access cell with column address information of the at least one defective cell; and
when the column address of the second access cell is the same as a column address in the column address information of the at least one defective cell, replacing the second access cell with a second spare cell or a third spare cell included in the spare area of the memory cell array disposed separately from the normal area of the memory cell array,
when the row address of the second access cell is different from a row address in the row address information of the first access cell, the second access cell is replaced with the second spare cell disposed at the same column at which the first spare cell is disposed, and
when the row address of the second access cell is the same as the row address of the first access cell and the column address of the second access cell is different from the column address of the first access cell, the second defective cell is replaced with the third spare cell disposed at a column different from the column at which the first spare cell is disposed.

* * * * *